US007375312B2

(12) United States Patent
Butterworth

(10) Patent No.: US 7,375,312 B2
(45) Date of Patent: May 20, 2008

(54) PLANAR FLY'S EYE DETECTOR

(75) Inventor: Mark Butterworth, Santa Clara, CA (US)

(73) Assignee: Avago Technologies ECBU IP Pte Ltd, Singapore (SG)

( * ) Notice: Subject to any disclaimer, the term of this patent is extended or adjusted under 35 U.S.C. 154(b) by 100 days.

(21) Appl. No.: 11/044,500

(22) Filed: Jan. 26, 2005

(65) Prior Publication Data

US 2006/0163449 A1 Jul. 27, 2006

(51) Int. Cl.
*H04N 3/14* (2006.01)
(52) U.S. Cl. ............................ 250/214 R; 250/216
(58) Field of Classification Search ............ 250/214 R, 250/216; 347/272
See application file for complete search history.

(56) References Cited

U.S. PATENT DOCUMENTS

| | | | | |
|---|---|---|---|---|
| 4,807,978 A | * | 2/1989 | Grinberg et al. ............... 359/20 |
| 4,831,259 A | * | 5/1989 | Meixner ....................... 250/353 |
| 5,324,930 A | * | 6/1994 | Jech, Jr. ....................... 250/216 |
| 5,751,492 A | * | 5/1998 | Meyers ......................... 359/619 |
| 6,141,048 A | * | 10/2000 | Meyers ......................... 348/294 |
| 6,909,554 B2 | * | 6/2005 | Liu et al. ...................... 359/626 |
| 6,970,293 B2 | * | 11/2005 | Natori .......................... 359/626 |
| 2003/0011888 A1 | * | 1/2003 | Cox et al. ...................... 359/626 |

\* cited by examiner

*Primary Examiner*—Thanh X. Luu
*Assistant Examiner*—Tony Ko

(57) ABSTRACT

A fly's eye detector includes a planar imaging array and an optical system that directs light with different incident directions to different sensors in the imaging array. One embodiment of the optical system includes a curved reflector above the planar imaging array to deflect and distribute light to the sensors. Another embodiment of the optical system includes a lens array providing variable offsets of microlenses relative to the underlying sensors.

5 Claims, 2 Drawing Sheets

PLANAR FLY'S EYE DETECTOR

BACKGROUND

A fly's eye uses multiple lenses to efficiently collect light originating from a wide angular range. FIG. 1 shows a cross-section of a fly's eye 100 that includes an array of lenses 110 covering a curved surface 120. Each lens 110 has an optical axis along a different direction, and each lens 110 forms an image of a different portion of a surrounding scene on a corresponding image plane 130. Fly's eye 100 can locate an object by identifying which of the lenses 110 form images of the object and can track the object as the object moves from the field of one lens 110 to the next.

Astronomical detectors such as cosmic ray detectors have mimicked the properties of a fly's eye using arrays of separate sensors. In such systems, each sensor has a sensing axis pointed in a different direction to enable simultaneous detection of radiation from all directions of sky. These detector systems are generally large, complex, and expensive.

Manufacturing an inexpensive fly's eye detector using integrated circuit technology would be very desirable for applications requiring information from a wide-angle field. However, a solid-state detector having the configuration of fly's eye 100 would be difficult to construct because current semiconductor processing techniques are generally not intended for processing of globally curved surfaces. For example, conventional photolithography generally has a limited depth of focus and may be unable to accurately control patterns on a hemispherical surface. Many other semiconductor manufacturing techniques are similarly ill suited for fabrication of devices such as image sensors or photodiodes on a curved surface.

Methods and structures that provide features of a fly's eye in an inexpensive detector system constructed using conventional semiconductor processing techniques are sought.

SUMMARY

In accordance with an aspect of the invention, a fly's eye detector is constructed using a planar imaging array that can be fabricated using conventional processing techniques. One embodiment of the invention employs a curved reflector above the planar imaging array to deflect and distribute light with different incident directions to corresponding sensors in the planar imaging array. An alternative embodiment of the invention uses variable offsets of micro-lenses relative to the underlying sensors to achieve the desired selection of the directions of the light incident on respective sensors. Either embodiment can achieve coverage of a 360° panoramic field of view.

One specific embodiment of the invention is a detector including a semiconductor device containing a planar array of sensors and an optical system that directs light with different incident directions to different sensors in the array. The optical system can employ a curved reflector overlying the sensors, so that the sensors receive light after reflection from the curved reflector. The curved reflector can reside in a depression in a layer formed on the semiconductor device or can be a separate optical element that is mounted with the semiconductor device in a device package. Alternatively or in addition, the optical system can include an array of lenses with each of the lenses focusing light on a corresponding one of the sensors. To help direct light with different incident angles to different detectors, each lens may have an offset relative to the corresponding lens, with the offsets being selected according to the incident directions for the sensors.

Another specific embodiment of the invention is a fly's eye detector that includes a semiconductor device containing an array of sensors and an array of lenses overlying the array of sensors. Each of the lenses focuses light on a corresponding one of the sensors and has an offset relative to the corresponding sensor. The offsets of the lenses generally vary across the array of lenses. For example, in one embodiment, the offsets have respective magnitudes that are a function of a distance from a center of the array and have respective directions matching directions of respective vectors extending from the center to the corresponding sensor. In another embodiment, the array of lenses has a pitch that differs from the pitch of the array of sensors.

Yet another embodiment of the invention is a sensing process that includes: directing light incident from each of a plurality of directions into respective sensors in a planar sensor array; and sensing with each sensor an intensity of the incident light from a corresponding one of the directions. Directing the light can be achieved by positioning a curved reflector above the planar array so that the light is reflected from the curved reflector into the sensors. Alternatively or additionally, lenses that focus light on respective sensors in the sensor array can be offset from the corresponding sensors with each offset being selected to direct light from the direction associated with the sensor into that sensor.

BRIEF DESCRIPTION OF THE DRAWINGS

Use of the same reference symbols in different figures indicates similar or identical items.

DETAILED DESCRIPTION

In accordance with an aspect of the invention, a fly's eye detector uses a planar sensor array with an optical system that channels incoming light so that each sensor in the array receives light predominantly from a different angular range. In one embodiment the optical system includes a curved reflector such as a hyperbolic, parabolic, or hemispherical mirror positioned above the sensor array. In another embodiment, the optical system uses an array of lenses over the imaging array, and each lens is offset from a corresponding sensor by an offset selected according to the desired angular range of light to be sensed by the corresponding sensor. One or more field stop or field mask can be integrated in the sensor array to improve selectivity of the angular range for each sensor and to reduce crosstalk or light leakage.

Figure 1:
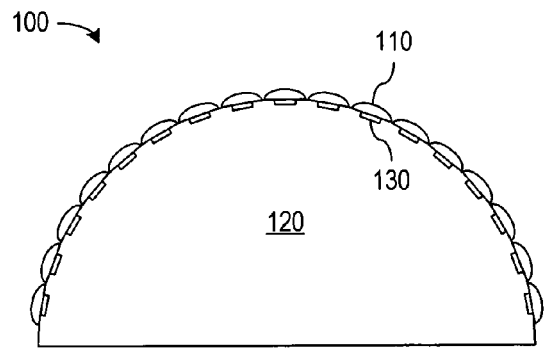
FIG. 1 shows a cross-section of a fly's eye.
Figure 2:
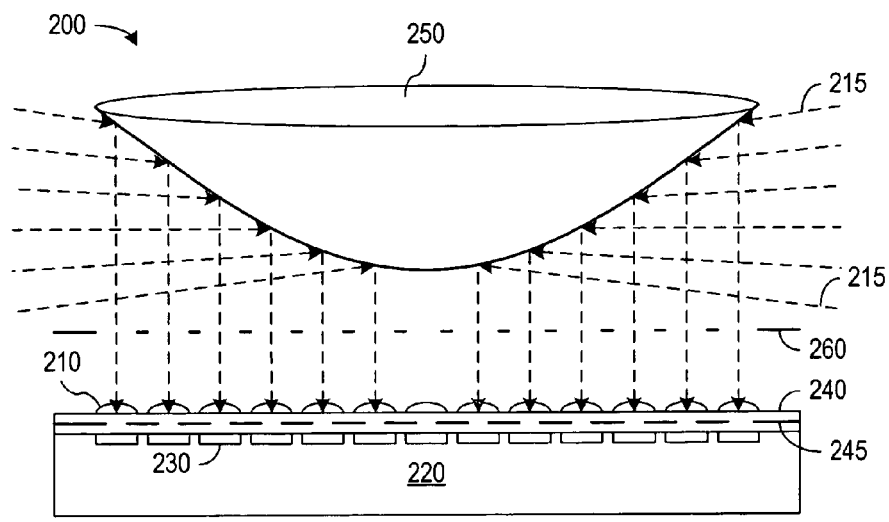
FIG. 2 shows a fly's eye detector in accordance with an embodiment of the invention including a reflector over a planar imaging array.

FIG. 2 illustrates a fly's eye detector 200 in accordance with an embodiment of the invention. Fly's eye detector 200 includes a semiconductor device 220 containing a planar sensor array made up of sensors 230 and auxiliary circuitry (not shown). The sensor array can be manufactured using conventional semiconductor processing techniques that are well known for manufacture of CCD and CMOS image sensors. Other technology for fabricating sensor arrays may also be suitable. Generally, such arrays include sensors containing photodiodes that are arranged in a square or rectangular grid. However, other array configurations, e.g., omitting sensors near corners of the array or arranging the sensors on a hexagonal grid or a circularly symmetric configuration, could be employed.

As illustrated in FIG. 2, one or more layers 240 of device 220, which may for example, include conductive traces and insulating layers, generally overlie the photosensitive areas of the photodiodes in sensors 230. Overlying layers 240 may additionally include one or more patterned layers 245 that operate optically as field stops or flare stops for sensors 230.

An array of lenses 210 is on a top surface of semiconductor device 220 and positioned so that each lens focuses light onto a corresponding sensor 230. Lenses 210 can be formed of a material such as photoresist or polyimide and fabricated using conventional techniques that are well known for lenslet arrays. One exemplary fabrication process for lenses 210 begins by depositing a layer of a desired thickness (e.g., 1 to 1.5 microns) of photoresist on layers 240. A photolithography process then patterns the photoresist layer so that separated regions of the photoresist overlie respective sensors 230. The regions are then heated to near or above the melting point of the photoresist, so that surface tension reshapes the photoresist regions into lens shapes that remain when the photoresist cools.

A curved reflector 250 is above the sensor array. In some exemplary embodiments, a cross-section of reflector 250 passing through the vertex of reflector 250 may be shaped as a portion of a hyperbola, a parabola, or a circle. The shape of reflector 250 is preferably such that light rays 215 that enter sensors 230 through the centers of lenses 210 converge from a range of polar angles. In general, the surface of reflector 250 can be a surface of revolution, so that the optical performance of reflector 250 is the same for the entire 360° range of azimuthal angles, i.e., around the horizontal plane.

In one embodiment of the invention, reflector 250 is an optical element that is formed separately from device 220 and is mounted as part of a package including semiconductor device 220. The packaging structure (not shown) can hold reflector 250 in place with an air gap between reflector 250 and lenses 210.

In an alternative embodiment of the invention, reflector 250 is formed on the top surface of a layer (not shown) deposited on lenses 210 and device 220. More specifically, a layer of a material having a refractive index lower than that of the material forming lenses 210 can be deposited and shaped to create a depression having the desired shape of reflector 250. Accordingly, a higher density material or higher index material is preferred for lenses 210 in this embodiment of fly's eye sensor 200. A process such as electroform or molding could be used to give the layer the desired shape to the layer overlying lenses 210, e.g., to form a hyperbolic, parabolic, or hemispherical depression in the layer. A reflective material such as a metal (e.g., aluminum) or a multi-layer dielectric can then be deposited in the resulting depression.

Data output from device 220 can generally be in any form. For example, conventional gray-scale image sensors generally output an image frame as an array of pixel values, where each pixel value indicates a light intensity that a corresponding sensor 230 measures. One type of color image sensor similarly provides pixel values indicating light intensities through interleaved color filters. The distribution of incident light from different directions to different sensors 230 will produce a pixel array representing a distorted image. However, image processing of the raw data can construct panoramic images for human viewing. Alternatively, the raw pixel data can be used for machine vision applications, for example, where a compact system monitors a large angular range. In particular, the ability of detector 200 to provide a 360° panoramic sensing range makes detector well suited for motion sensing in alarm systems.

Figure 3:
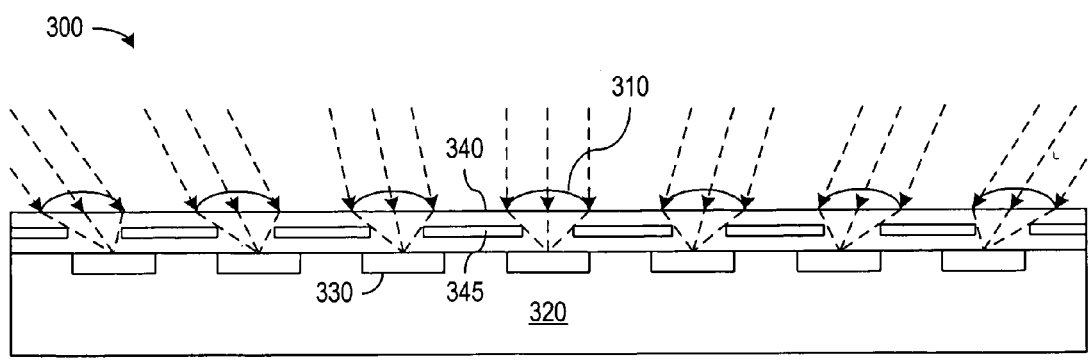
FIG. 3 shows a fly's eye detector in accordance with an embodiment of the invention including a planar imaging array with offset microlenses.

FIG. 3 illustrates a fly's eye detector 300 in accordance with an embodiment of the invention that does not require an optical element above an array of lenses 310. Fly's eye detector 300 includes a semiconductor device 320 that can be CCD or CMOS image sensor that is substantially identical to semiconductor device 220 of FIG. 2. Device 320 generally includes a planar array of sensors 330 and auxiliary circuits (not shown). Layers 340, which may include conductive traces and insulating layers, overlie the light sensitive regions (e.g., photodiodes) in sensors 330. One or more masking layers 345 are optionally included among layers 340 to provide field stops and/or flare stops for sensors 330.

Lenses 310 are on layers 340 and are offset relative to the centers of respective sensors 330. With the offsets, incident light passing through the center of each lens 310 to the corresponding sensor 330 is at an angle relative to the plane of the array of sensors, and each angle depends on the offset of the lens 310 relative to the corresponding sensor. Mask layer 345, which can be made of any opaque material available during fabrication of device 320, has openings that act as field or flare stops for respective sensors. The openings in mask layer 345 are preferably centered along the paths through the centers of lenses 310 to the corresponding sensors 330 and sized according to the desired range of incident angles measured by the corresponding sensor 330.

Figure 4:
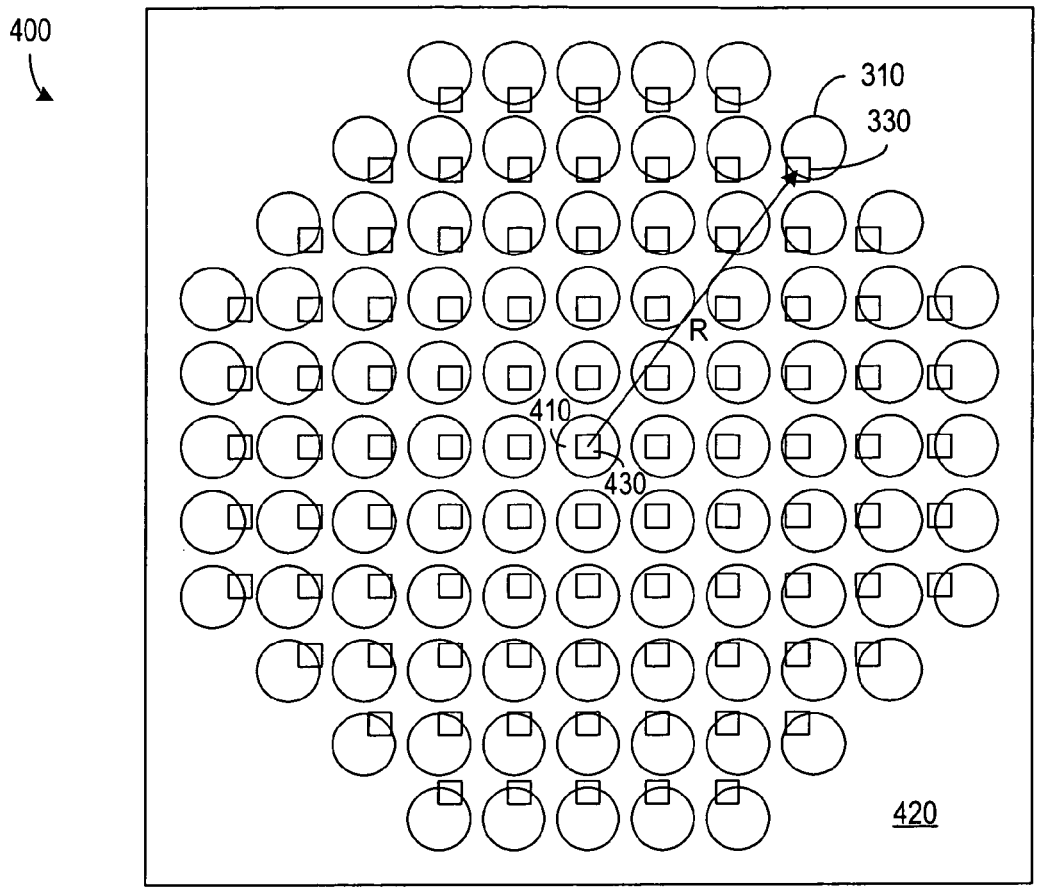
FIG. 4 shows a plan view of a fly's eye detector in accordance with an embodiment of the invention including microlenses having offsets selected to direct light from different incident directions into different sensors.

FIG. 4 shows plan view of the exemplary embodiment of a fly's eye detector 400 having a structure and cross-section as described above in regard to FIG. 3. In FIG. 4, one lens 410 is at the center of the array and is directly over a corresponding sensor 430, but the center of the array may alternatively be between sensors 310. The lens 410 at the center of the array has no offset relative to sensor 420, but the offsets of other lenses 310 from their respective sensors 330 increase with distance from the center. In an exemplary embodiment of the invention, the magnitude offset of the center of each lens 310 relative to the center of the photosensitive center of the corresponding sensor 330 is a function $f(r)$ of the radial distance r between the sensor 330 and a center of the array, and the direction of the offset is preferably the same as the direction of the vector R extending from the center of the array to the center of the sensor 330. This radially symmetric configuration provides the fly's eye detector 400 of FIG. 4 with a field of view including a range of polar angles that is approximately the same for the entire 360° range of azimuthal angles.

The offsets in the radial symmetric configuration of fly's eye detector 400 can have any desired functional dependence $f(r)$ on the radial distance r. However, offsets with magnitudes $\Delta$ satisfying Equation 1 can uniformly distribute incident polar angles to sensors 330. In Equation 1, k is a constant that in general depends on the desired range of polar angles, the dimensions of the sensor array, and the thickness of layers separating lenses 310 from the photosensitive regions of sensors 330. The desired offsets can be achieved using a non-uniform pitch for the array of lenses 310, the array of sensors 330, or both.

$$\Delta = f(r) = \arctan(kr) \qquad \text{Equation 1}$$

In another embodiment of sensor 400, lenses 310 are arranged in an array of the same type as the array of sensors 330, and both arrays have uniform pitch. The pitch of array of lenses 310 differs from the pitch of sensors 330 to provide varying offsets. When both pitches are uniform, the offsets increase proportionately with the distance from a point where the arrays are aligned. However, using uniform pitches will generally fail to distribute incident angles uniformly across the array of sensors 330.

Figure 5:
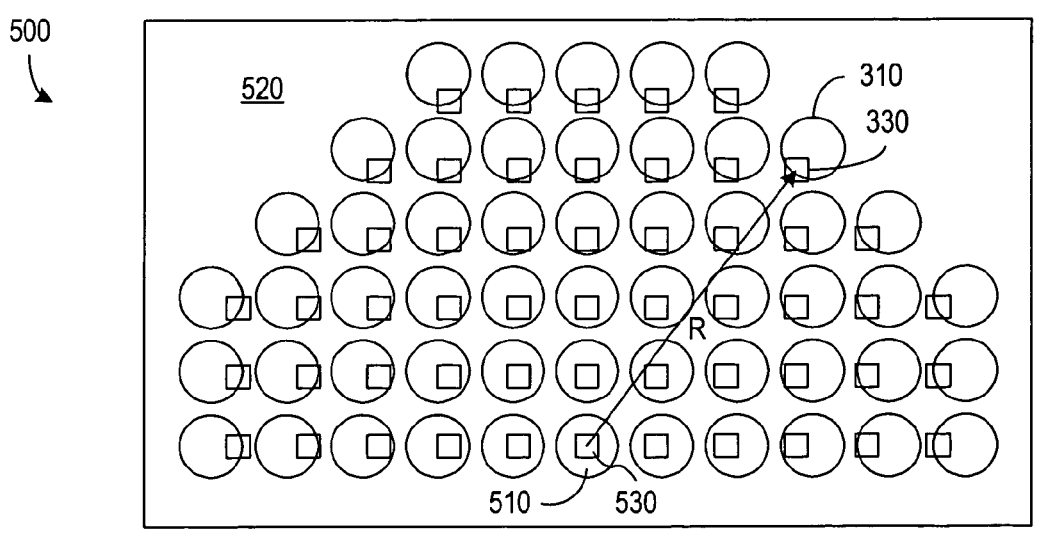
FIG. 5 shows a plan view of a fly's eye detector in accordance with an embodiment of the invention including microlenses in an asymmetric arrangement.

FIG. 5 illustrates a fly's eye detector 500 having offsets that are not symmetric about the center of the array of lenses 310 or sensors 330 the illustrated configuration of fly's eye detector 500 includes a lens 510 that is aligned with the photosensitive region of the corresponding sensor 530, but the aligned lens 510 and sensor 530 are not at the center of the sensor array. With the aligned lens/sensor an edge of the sensor array, asymmetric fly's eye detector 500 provides sensing for a 180° range of azimuthal angles. More generally, an asymmetric fly's eye detector can provide greater effective sensor density for optical sensing of a particular azimuthal angle or a particular range of azimuthal angles.

Although the invention has been described with reference to particular embodiments, the description is only an example of the invention's application and should not be taken as a limitation. For example, although the above embodiments employ curved reflectors or offsets of lenses to distribute the sensing directions of a planar sensor array, a fly's eye detector can employ a curved reflector and offsets between lenses and corresponding sensors in combination to achieve a desired angular range for sensing. Various other adaptations and combinations of features of the embodiments disclosed are within the scope of the invention as defined by the following claims.

What is claimed is:

1. A detector, comprising:
   a semiconductor device containing an array of sensors;
   an optical system that directs light with different incident directions to different sensors in the array, the optical system comprising a curved reflector overlying the sensors, wherein the sensors receive light along respective optical axes after reflection of the light from the curved reflector; and
   an array of lenses between the curved reflector and the sensors.

2. The detector of claim 1, wherein each of the lenses in the array focuses light on a corresponding one of the sensors and has an offset relative to the corresponding sensor, the offsets of the lenses varying across the array of lenses.

3. The detector of claim 1, wherein the array of sensors is substantially planar.

4. The detector of claim 1, wherein the semiconductor device and the curved reflector are mounted in a device package that positions the reflector above the sensors.

5. A process, comprising:
   directing light incident from each of a plurality of directions into respective sensors in a planar sensor array, wherein directing the light comprises positioning a curved reflector above the planar array so that the light is reflected from the curved reflector into the sensors and using an array of lenses between the curved reflector and the sensors to focus light on the sensors from the respective directions; and
   sensing with each sensor an intensity of the incident light from a corresponding one of the directions.

* * * * *